United States Patent [19]

Sacchi et al.

[11] Patent Number: 5,126,591
[45] Date of Patent: Jun. 30, 1992

[54] ELECTRONIC COMPARATOR DEVICE WITH HYSTERESIS

[75] Inventors: Fabrizio Sacchi, Gambarana; Gianfranco Vai, Pavia, both of Italy; Loic Lietar, Paris, France; Giorgio Betti, Milan, Italy

[73] Assignee: SGS-Thomson Microelectronics S.r.L., Italy

[21] Appl. No.: 605,504

[22] Filed: Oct. 30, 1990

[30] Foreign Application Priority Data

Nov. 10, 1989 [IT] Italy .................. 22335 A/89

[51] Int. Cl.[5] .................................. H03K 5/153
[52] U.S. Cl. ........................ 307/354; 307/359; 307/362
[58] Field of Search ............ 307/359, 362, 354, 494, 307/315, 350, 290

[56] References Cited

U.S. PATENT DOCUMENTS

| 4,962,323 | 10/1990 | Ta ........................... | 307/350 |
| 5,045,782 | 9/1991 | Koyama .................... | 307/362 |
| 5,068,552 | 11/1991 | Itou et al. ................. | 307/494 |

Primary Examiner—Eugene R. Laroche
Assistant Examiner—Evelyn A. Lester
Attorney, Agent, or Firm—Leydig, Voit & Mayer

[57] ABSTRACT

An electronic comparator device with hysteresis, being of a type which comprises a differential cell having a signal input, an output, and a threshold input, further comprises a second differential cell having one input connected to said output and the other input connected to a controlling circuit portion which has an output connected to the threshold input to reduce the threshold voltage value stepwise on the first change-over of the output of the comparator.

4 Claims, 2 Drawing Sheets

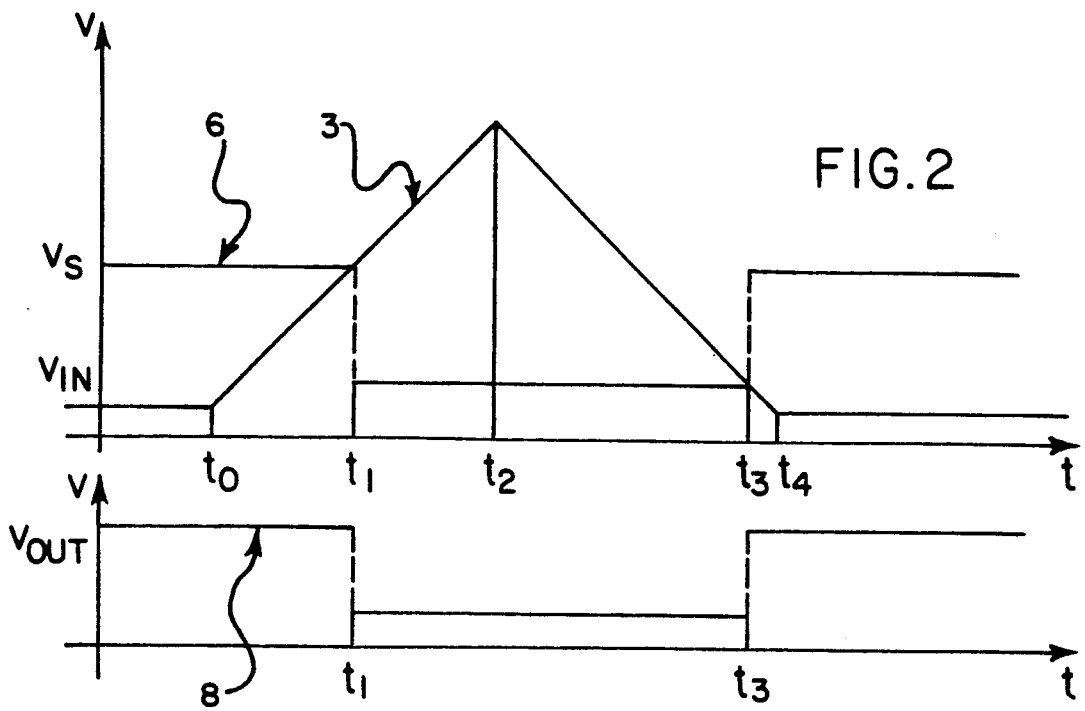
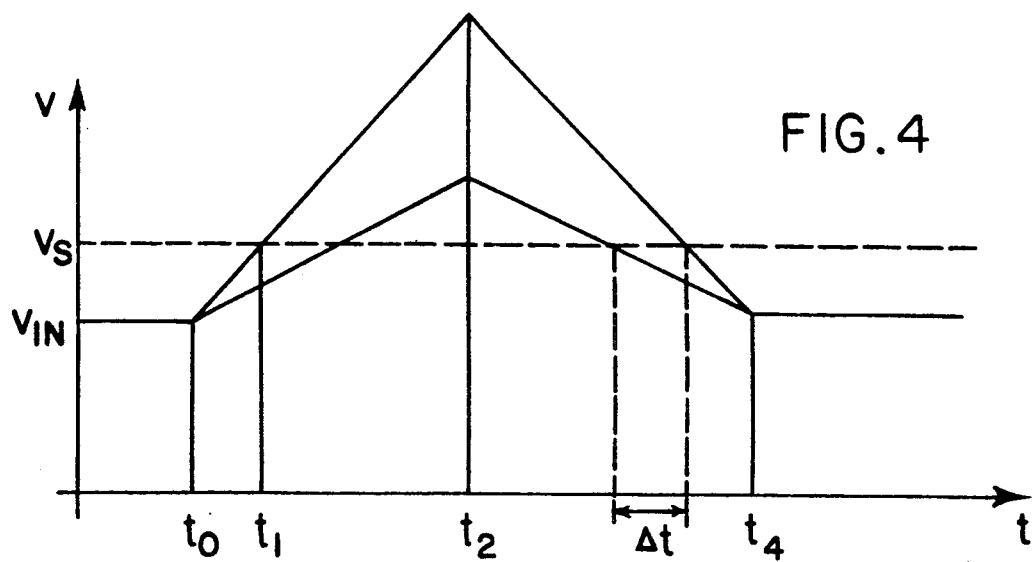

ELECTRONIC COMPARATOR DEVICE WITH HYSTERESIS

DESCRIPTION

This invention relates to an electronic comparator device with hysteresis, being of a type which comprises a differential cell having a signal input, an output, and a threshold input.

As is well known, comparator devices are widely used in a multiplicity of electronic control and actuation circuits to determine the moment that a signal having any waveform reaches a given reference level.

A prior comparator type may be comprised, for instance, of an operational amplifier, to the non-inverting input whereof a waveform to be compared is applied, whilst a reference or threshold voltage value Vs is maintained on its inverting input.

The comparator output takes a different value according to whether the amplitude of the signal in question lies below or above the threshold level. Normally, the output will only take two different levels, thus providing a binary function.

Where the input signal to the comparator results from the charging and discharging of a capacitor, to be provided by a current Io, said voltage signal may have two limiting waveforms according to the capacitor value. Such waveforms comprise a sawtooth broken line composed of a first, positive gradient slope, corresponding with the capacitor charging step, which merges with a successive, negative gradient slope corresponding with the discharge step.

The patterns for these waveform are also shown in FIG. 2 of the accompanying drawings.

Comparators according to the prior art generally have a fixed threshold level which is predetermined and causes the comparator output to change over at different times according to the gradient of the input signal waveform.

It could be also considered of keeping the value of the threshold voltage slightly above the so-called "clamp" voltage level, that is that voltage value from where the slope of the input signal will rise on the capacitor being charged.

However, by so doing, the comparator would be made highly sensitive to noise and deprived of a sufficient accuracy margin versus small variations in the threshold voltage and the so-called "offset" voltage drop across the input and the output.

The technical problem that underlies this invention is to provide a comparator device having such structural and functional characteristics as to attenuate the dependence of the output change-over on the gradient of the input signal waveform, thereby obviating a limitation to devices according to the prior art.

The solutive idea on which this invention stands consists of providing a comparator which has a threshold value dependent, with high-precision hysteresis, on the output value.

In accordance with the above solutive idea, the technical problem is solved by a comparator device as indicated being characterized in that it comprises a second differential cell having one input connected to said output and the other input connected to a controlling circuit portion provided with a respective output connected to said threshold input to reduce the threshold voltage stepwise concurrently with the first change-over of the comparator output.

The features and advantages of a comparator according to the invention will become apparent from the following detailed description of an embodiment thereof, given by way of illustration and not of limitation with reference to the accompanying drawings.

In the drawings:

FIGS. 2 and 3 show respective schematical patterns for waveforms of signals appearing on the input and the output of the comparator shown in FIG. 1; and FIG. 4 shows the pattern for signal waveforms in prior art comparators.

Figure 1:
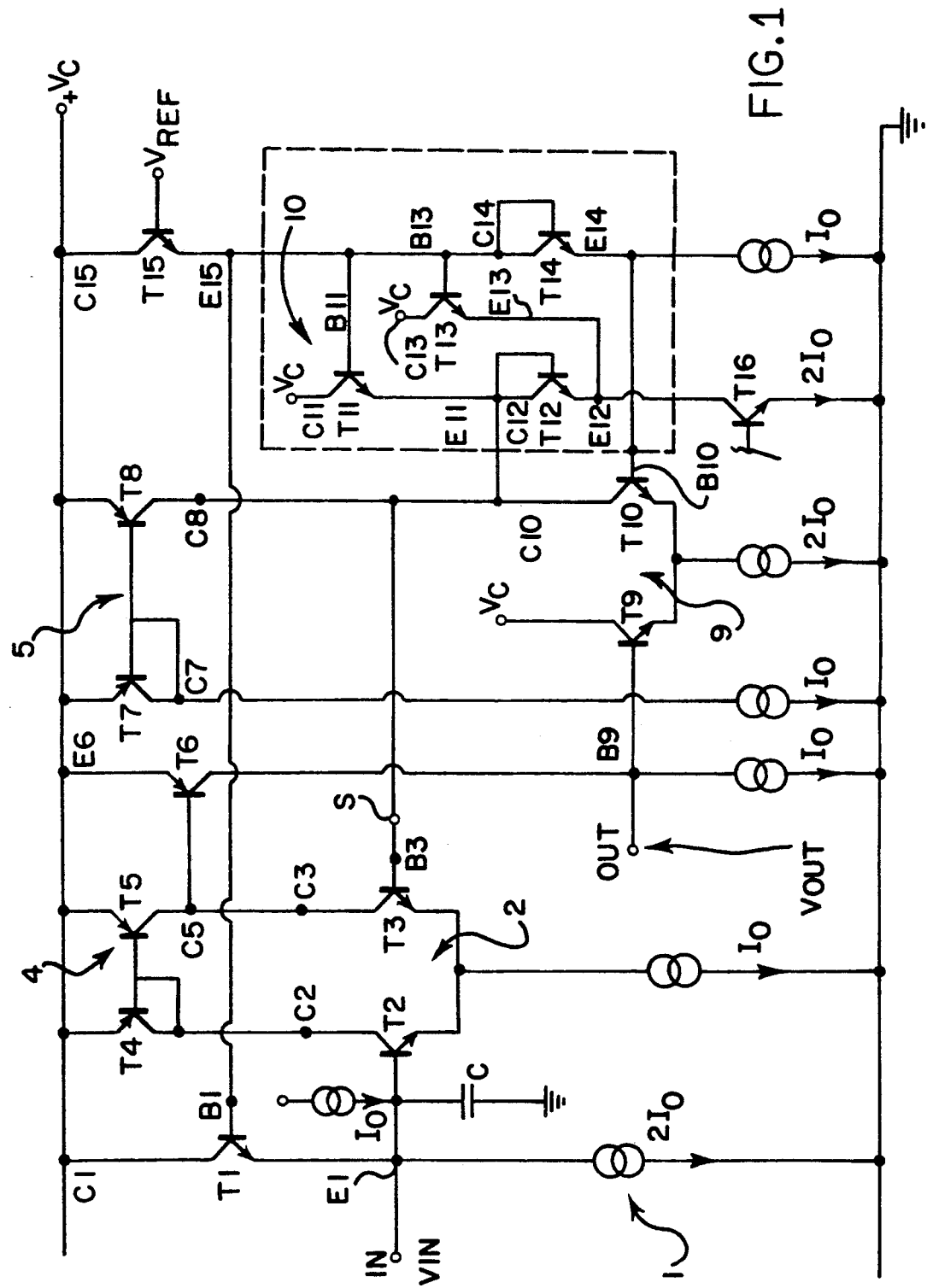
FIG. 1 is a diagramatic view of the comparator of this invention.

With reference to the drawing views, generally and schematically shown at 1 is an electronic comparator device having, in accordance with the invention, a threshold voltage Vs variable with high-precision hysteresis.

The device 1 comprises a first differential cell 2 composed of a pair of npn-type transistors T2 and T3, having their respective emitters connected together and to ground via a current source Io.

The base B2 of transistor T2 is connected to a terminal IN constituting a signal input for the comparator 1 and on which a voltage signal Vin appears having the pattern depicted by the waveform 3 in FIG. 2 and resulting from charging and subsequently discharging a capacitor C through which the current Io is caused to flow.

The base B3 of transistor T3 constitutes instead the threshold input S for the comparator 1 on which a voltage value Vs is present which follows the pattern depicted by the waveform 8 in FIG. 2.

The respective collectors C2 and C3 of the transistors T2 and T3 are connected to a positive supply pole +Vc via a pair of transistors T4 and T5 connected together into a current mirror configuration. The transistors T4 and T5 are both of the pnp type, with their respective bases connected together. The former transistor is associated, in a diode configuration, with the transistor T2, whilst the transistor T5 has its collector C5 connected both to the collector C3 and the base B6 of a pnp transistor T6 having the emitter E6 connected to the pole Vc.

This transistor T6 has the collector C6 connected to an output terminal OUT, constituting the output for the comparator 1, and to ground via a source Io.

Also provided are a pair of transistors T1, T15 connected together into a Darlington configuration, with the emitter E15 connected to the base B1 and the respective collectors C1, C15 connected to the supply pole Vc. Both of these transistors are of the npn type, and a reference voltage value Vref is maintained on the base B15 of transistor T15.

The emitter E1 of transistor T1 is connected to the input terminal IN and to ground through a current source having the value of 2Io.

Further provided in the comparator 1 is a second differential cell 9 comprising a pair of transistors T9 and T10, of the npn type, with the respective emitters connected together and to ground through a source of bias current having the value of 2Io.

The transistor T9 has, as an input for the cell 9, its base B9 connected directly to the output terminal OUT and its collector C9 connected to the supply pole Vc. The other transistor T10 has its base B10 connected, as a second input, both to ground via a current source Io, and to the emitter E14 of an npn transistor T14 connected in the device 1 into a diode configuration with the collector C14 connected directly to the emitter E15 of the transistor T15.

A second current mirror 5 composed of pnp-type transistors T7 and T8 having their respective emitters connected to the pole Vc and the bases connected together, connects a current source Io to the collector C10 of transistor T10. In particular, the transistor T7 has, in a diode configuration, its collector C7 connected to said source Io, whilst the collector C8 of transistor T8 is connected to the collector C10.

The threshold input S is also connected to said collector C10 of transistor T10 in the cell 9.

Advantageously, the comparator 1 is provided with a circuit portion 10 effective to regulate the voltage value Vs present on the threshold input S.

Specifically, that circuit portion 10 comprises a pair of transistors T11, T13 of the npn type having respective bases B11, B13 which are both connected to the emitter E15 of the transistor T15, and respective collectors C11, C13 connected to the pole Vc.

In addition, the emitter E11 of transistor T11 is connected to the collector C12 of a further npn transistor T12 also connected to the collector C10 as an output for the portion 10.

The aforesaid transistor T12 is connected in the portion 10, into a diode configuration with the emitter E12 connected to the emitter E13 of transistor T13 and to ground through a transistor T16 operative as a current source with a value of 2Io.

The operation of the inventive comparator will be now described with reference to FIGS. 2 to 4 showing waveforms of signals having the same time base.

Up to time to, the value of the voltage Vin present on the input terminal IN will keep always above a so-called clamp value given by the following relation:

$$Vin = Vref - 2Vbe \qquad (1)$$

where Vref is the value of the reference voltage present on the base B15 of transistor T15, and 2Vbe is the sum of the base-emitter voltage drops present on the transistors T1 and T15.

The voltage present on the base B10 of transistor T10 will coincide with said voltage value Vin present on the terminal IN, due to the base-emitter voltages of the transistors T14 and T15 which are conducting at all times.

Under such conditions, the output terminal OUT will be at a logic high, because of the presence of a voltage value Vout thereon, which is indicated at 8 in FIG. 3 and equal to:

$$Vout = Vc - Vce\, sat \qquad (2)$$

where Vce is the collector-emitter voltage drop of the transistor T6 in saturation.

This is due to the transistor T9 of the cell 9 being in conduction, whilst the transistor T10 is in the off state and the mirrored current Io from the mirror 5, composed of the transistors T7 and T8, can only flow, therefore, through the transistor T12.

The transistor T13 is also conducting and a current Io flows therethrough which is drained off, along with that flowing through the parallel transistor T12, by the transistor source T16 which will impose a current value of 2Io.

The value of the threshold voltage Vs present on the terminal S is indicated by the waveform 6 in FIG. 2.

The voltage present on the base B13 of transistor T13, and hence on the base B11, is given by the reference Vref less the base-emitter voltage drop of transistor T15. But that voltage value is also present on the collector C12 of transistor T12, on the emitter E11 and the base B3 of transistor T3, being the equivalent of the threshold input S, to keep the transistor T11 off and the transistor T3 conducting because the voltage Vs on the base B3 is higher than that on the input terminal IN.

The transistor T2 is in the off state and the current flowing through the transistor T3 brings the transistor T6 to saturation while maintaining the voltage on the output OUT stable and at a logic high.

At the time t1, the positive gradient slope of the voltage Vin signal 3 present on the input terminal IN, shown in FIG. 2 will have reached a value of Vref−Vbe.

The transistor T2 will be then turned on and the transistor T3 be simultaneously turned off. Consequently, the mirrored current from the mirror 4, comprising the transistors T4 and T5, will drive the transistor T6 off, causing the output OUT to change over to a logic low. Thus, the value Vs of the threshold voltage is reduced stepwise on the first change-over of the comparator output OUT.

Since the base of the transistor T9 is connected to the output OUT, this transistor will change over to an off state, thus enabling the other transistor T10 to be on and conduct a current of 2Io.

The current flowing through the transistor T10 is twice that mirrored through the transistor T8, which turns on the transistor T11 to conduct, in turn, a current Io.

The voltage Vs on the base B3 will then decrease to a value given by:

$$Vref - Vbe\,(T15) - Vbe\,(T11) \qquad (3)$$

where the Vbe entries denote the respective base-emitter voltage drops of the transistors T15 and T11 with one and the same current Io flowing therethrough.

This voltage is in all cases higher than the starting voltage value on the terminal IN at time to, because the current flowing through the transistor T1 at time +0 was twice that flowing through T11 at time t1.

At a successive time, indicated at t2, the voltage Vin on the input IN will change to a pattern represented by the down slope of the signal 3, e.g. due to the capacitor C being discharged.

The voltage value Vout on the output OUT will remain at a logic low until the voltage on the input IN reaches, at the time t3, the value indicated by relation (3) above.

On that value being reached, the transistor T2 will be turned off and transistor T3 turned on, which restores the circuit to its original state with the output OUT value at a high.

The voltage on the input IN will continue to decrease until it reaches the original clamp value given by relation (1) above.

It will be appreciated from the foregoing description that the comparator device according to the invention has a major advantage in that it is provided with a threshold input which follows substantially the pattern of the output voltage Vout. This allows a considerable reduction in the time range when the output is changed over as the gradient of the input signal varies. In addition, the comparator hysteresis is a high-precision one, and may be made as small as desired, in the order of 10 mV, to eliminate the so-called spread of the circuit components.

It may be also appreciated comparatively from FIG. 4 that the time when the output Vout would be changed over, using a fixed threshold comparator according to the prior art, would be dependent on the gradient of the slope 3 and show considerable variability.

We claim:

1. An electronic comparator device with hysteresis, comprising a first differential cell, said first cell having a signal input, an output, and a threshold input, and a second differential cell, said second cell having one input connected to said first differential cell output and said second cell having its other input connected to a controlling circuit portion, said controlling circuit portion having an output connected t said threshold input, said controlling circuit portion output serving to reduce the voltage at said threshold input concurrently with the first change-over of the comparator output.

2. A comparator device according to claim 1, characterized in that said controlling circuit portion comprises a first transistor in a diode configuration and with the emitter connected to the other input of said second cell, second and third transistors having respective bases connected to the collector of said first transistor and respective collectors connected to a positive supply pole, as well as a fourth transistor in a diode configuration and having the collector connected to the emitter of the second transistor, constituting the output of said portion and the emitter connected both to the emitter of said third transistor and to ground via a current source.

3. A comparator device according to claim 1, said comparator device characterized in that it comprises a pair of transistor connected to each other in a Darlington configuration with respective collectors connected to a positive supply pole and the emitter of a first thereof connected to said signal input of the comparator, the base of the second in said transistor pair being held at a reference voltage value.

4. A comparator device according to claim 2, said comparator device characterized in that it comprises a current mirror connected between a current source having a predetermined value and he output of said controlling circuit portion.

* * * * *